United States Patent [19]

Kasperkovitz

[11] Patent Number: 4,973,920
[45] Date of Patent: Nov. 27, 1990

[54] CONTROLLABLE QUADRATURE OSCILLATOR

[75] Inventor: Wolfdietrich G. Kasperkovitz, Eindhoven, Netherlands

[73] Assignee: U.S. Philips Corporation, New York, N.Y.

[21] Appl. No.: 438,288

[22] Filed: Nov. 16, 1989

[30] Foreign Application Priority Data

Nov. 28, 1988 [NL] Netherlands ................ 8802916

[51] Int. Cl.⁵ .............................. H03B 27/00
[52] U.S. Cl. .................... 331/45; 331/108 B; 331/135
[58] Field of Search ............ 331/45, 108 R, 108 B, 331/135, 136, 177 R

[56] References Cited

U.S. PATENT DOCUMENTS 3,936,773 2/1976 Wilkinson .............. 331/177 R X
4,145,670 3/1979 Bode ...................... 331/135

FOREIGN PATENT DOCUMENTS 1406438 9/1975 United Kingdom .

Primary Examiner—Robert J. Pascal
Attorney, Agent, or Firm—Jack D. Slobod

[57] ABSTRACT

A controllable quadrature oscillator, having a pair of oscillator outputs for supplying a pair of phase quadrature oscillator signals, is a cascade circuit of two quadrature sections incorporated in a regenerative loop each contributing a 90° phase shift in the regenerative state of the loop. In order to increase the frequency control range of such a controllable quadrature oscillator and to enable realization by integrated circuit technology, each quadrature section is formed of two stages in cascade arranged in a signal path between an input terminal and an output terminal for the quadrature section. One of the stages includes a first amplifier having a low-pass characteristic and the other of the stages includes a second amplifier having a low-pass characteristic and having a feedback path. The gain of at least one of the two amplifiers is controllable for controlling the frequency of the pair of phase quadrature oscillator signals.

19 Claims, 2 Drawing Sheets

CONTROLLABLE QUADRATURE OSCILLATOR

BACKGROUND OF THE INVENTION

The invention relates to a controllable quadrature oscillator having a pair of oscillator outputs for supplying a pair of phase quadrature oscillator signals, and a cascade circuit of two quadrature sections, which circuit is incorporated in a regenerative loop, one of the two quadrature sections being arranged between the two oscillator outputs and realizing a 90° phase shift in the regenerative state of the loop.

Such a controllable quadrature oscillator is known, for example, from U.S. Pat. No. 3,936,773.

The cascade circuit of the two quadrature sections is regeneratively fed back from the output to the input for the frequency at which the gain in the loop formed for the quadrature sections and the feedback is one and a phase shift of 90° occurs in each of the two quadrature sections. To this end each of the two quadrature sections of the known quadrature oscillator comprises an integrator and an analog multiplier.

For each frequency within a given frequency range the integrator realizes a 90° phase shift, while the loop gain for a desired frequency within the last-mentioned frequency range is controlled at the value of one by means of the said analog multiplier of each of the two quadrature sections. Since this frequency range determines the oscillator control range and in itself is comparatively narrow (in practice the integrators realize an accurate 90° phase shift only for some frequencies), the known quadrature oscillator comprises a phase correction circuit in which an amplitude controllable part of the output signal of one of the two quadrature sections is added to its input signal. Although this results in a given increase of the oscillator control range, it appears in practice that the control range of the known oscillator is limited at its upper side to a maximum value of the order of 100 kHz and unwanted large deviations in the phase quadrature relation between the two phase quadrature oscillator signals are not prevented by means of the said phase correction circuit. Moreover, comparatively large time constants are required for low oscillation frequencies in the known oscillator. To realize such large time constants in integrated circuits, a comparatively large quantity of chip surface is required so that the known oscillator, particularly for low oscillator frequencies, is less suitable for integration.

It is an object of the invention to provide, inter alia, an integrable quadrature oscillator which, as compared with the known quadrature oscillator, provides a considerably more accurate phase quadrature relation between the two phase quadrature oscillator signals and which relation can the maintained over a frequency range extending from a lower limit frequency to an upper limit frequency which is many times lower and may even be negative or which is many times higher, respectively, than that of the frequency range of the known quadrature oscillator.

According to the invention a controllable quadrature oscillator of the type described in the opening paragraph is therefore characterized in that at least the said quadrature section comprises a cascade circuit of two stages arranged in a signal path between an input terminal and an output terminal, one stage comprising a first amplifier having a low-pass characteristic and the other stage comprising a second amplifier having a low-pass characteristic, said second amplifier having a feedback path and the gain of at least one of the two amplifiers being controllable for controlling the frequency of the pair of phase quadrature oscillator signals.

The invention is based on the recognition that a feedback amplifier varying in gain and having a given, fixed low-pass characteristic effectively exhibits a time constant varying with the gain and that together with a further fixed time constant, and by means of a correct gain control it is particularly suitable for shifting the desired frequency within the variation range of this effective time constant accurately through 90° in a quadrature section of a quadrature oscillator.

When using the measure according to the invention, the controllable effective time constant of the second amplifier realizes a controllable phase shift in addition to a phase shift which is realized by the fixed time constant of the first amplifier so that a total phase shift of 90° is achieved for a desired frequency. Whereas the gain of the second amplifier is mainly adjusted for obtaining an accurate 90° phase shift for the desired frequency, the gain of the first amplifier is mainly adjusted for adjusting the loop gain at a value of one for this frequency. As a result, the frequency control range and the accuracy of the phase quadrature relation between the two phase quadrature oscillator signals is fundamentally larger than in the case of the known quadrature oscillator.

For the said gain adjustment it is not necessary for each one of the two amplifiers of the quadrature sections to be controllable, but it may be sufficient for only one of the two amplifiers to be controllable and for the other amplifier to be an amplifier/limiter (clipper) if, for example, square wave-shaped oscillator signals are acceptable or desirable SInce an amplifier/limiter operating in its limiting mode has a gain which is dependent on the input signal amplitude, the gain of the amplifier/limiter can be simultaneously adjusted by means of a singe adjustment of the gain of the controllable amplifier at such a value that as a whole a gain of one is achieved for the desired frequency in the relevant quadrature section.

The controllable quadrature oscillator according to the invention is particularly suitable in an integrated form because parasitic capacitances which are inherent in integrated circuits and which of themselves realize a low-pass filter effect can then be utilized.

The accuracy of the said phase quadrature relation is enhanced in a preferred embodiment of the controllable quadrature oscillator according to the invention which is to this end characterized in that the other quadrature section also comprises a cascade circuit of two stages which correspond to the first-mentioned two stages, each quadrature section having a signal path between an input and an output incorporating the signal path of the first amplifier and the feedback path of the second amplifier, the signal path of the second amplifier being located outside the said signal path between the input and the output of each quadrature section.

For a further increase of the frequency control range such a controllable quadrature oscillator is characterized in that at least the second amplifier of each of the two quadrature sections has a first order low-pass characteristic.

A quadrature oscillator according to the invention, which is particularly suitable for generating phase quadrature oscillator signals having comparatively high frequencies, is preferably characterized in that the second amplifier of each of the two quadrature sections is negatively fed back via the feedback path and in that for increasing the oscillator frequency the gain of both the first and the second amplifier in each of the two quadrature sections increases, and conversely.

A quadrature oscillator according to the invention, which is particularly suitable for generating phase quadrature oscillator signals having lower frequencies as compared with the previous embodiment, is preferably characterized in that the second amplifier of each of the two quadrature sections is positively fed back via the feedback path and in that for increasing the oscillator frequency the ratio between the gain of the first amplifier and that of the second amplifier in each of the two quadrature sections increases, and conversely.

In order to avoid the use of large time constants in the last-mentioned controllable quadrature oscillator according to the invention, it is preferably characterized in that the stage comprising the second amplifier has an input in common with a third amplifier having a low-pass characteristic and a fixed gain, and an output which is coupled to a first input of a subtractor stage, an output of the third amplifier being coupled to a second input of the subtractor stage for subtracting the output signal at the third amplifier from that of the said stage comprising the second amplifier, the 3 dB limit frequencies of the first and third amplifiers being higher than that of the second amplifier.

Another alternative for avoiding large time constants is characterized by a fourth amplifier having a low-pass characteristic and a fixed gain, which amplifier has a positive feedback path whose signal path is located outside, and its positive feedback path is located in the signal path between the input and the output of each quadrature section, the 3 dB limit frequencies of the first and fourth amplifiers being higher than that of the second amplifier.

For obtaining sinusoidal oscillator signals having a high spectral purity and a frequency-independent amplitude, another preferred embodiment has an automatic gain control and is characterized in that the gains of the first amplifiers as well as those of the second amplifiers are mutually equal and are controllable in mutually equal directions by means of a first and a second control signal at a common first and a second control terminal, respectively, and in that a control signal generating circuit is arranged between the pair of oscillator outputs and the said first and second control terminals and comprises an amplitude detection device for detecting the amplitude of the vectorial sum of the phase quadrature oscillator signals, said amplitude being negatively fed back to the first and second control terminals for the purpose of automatic amplitude control of the oscillator signals.

A frequency-independent adjustment of the amplitude of the oscillator signals at a desired value in the last-mentioned controllable quadrature oscillator with a small harmonic distortion is possible in a further preferred embodiment which is characterized in that the amplitude detection device is coupled to the two control terminals via an amplitude level control device, an amplitude control signal being supplied from an amplitude control input to said amplitude level control device, which signal is subtracted in the amplitude level control device from the said amplitude to be negatively fed back of the vectorial sum of the phase quature oscillator signals.

A simple realization of this preferred embodiment is characterized in that the amplitude detection device comprises first and second squaring circuits which are coupled to the respective oscillator outputs and to two inputs of an adder stage, which adder stage is coupled to the two control terminals via a subtractor stage incorporated in the level control device, the amplitude control signal being subtracted in said subtractor stage from the said amplitude to be negatively fed back of the vectorial sum of the phase quadrature oscillator signals.

A considerable simplification of the frequency control of the last-mentioned controllable quadrature oscillator with a small harmonic distortion is achieved in yet another preferred embodiment which is characterized by a frequency control device which is arranged between the amplitude detection device and the first and second control terminals to which a frequency control signal is applied from a frequency control input, said frequency control device comprising a modulating device for mutually varying the first and second control signals in dependence upon the frequency control signal.

If square wave-shaped oscillator signals are desired, it is possible, for example, to incorporate the second amplifier in each of the two sections in an amplifier/limiter circuit and its control can then be dispensed with. Since a frequency control in each of the two sections is possible by means of only the first control signal at the first controllable amplifier, the control signal generating circuit can also be dispensed with.

A further preferred embodiment of a controllable quadrature oscillator according to the invention, which supplies phase quadrature oscillator signals whose mutual phase relation reverses sign when the first control signal reverses sign, is characterized in that the amplitude detection device is coupled to the two control terminals via an amplitude level control device to which an amplitude control signal is applied from an amplitude control input, which signal is subtracted in the amplitude level control device from the said amplitude to be negatively fed back of the vectorial sum of the phase quadrature oscillator signals.

In the case of a controllable quadrature oscillator with a small harmonic distortion the modulating device should also comprise a multiplier circuit in which the afore-mentioned frequency control signal is multiplied with the amplitude to be negatively fed back of the vectorial sum of the phase quadrature oscillator signals in such a way that a reversal of the sign of the frequency signal results in a reversal of the sign of at least the first control signal and hence in a reversal of the sign of the output signal of the first amplifier in each of the two sections.

According to the invention a practical preferred embodiment of a controllable quadrature oscillator with a small harmonic distortion is characterized in that the first and the second amplifier in each of the two quadrature sections is an emitter-coupled transistor pair and a transistor pair fed back from collector outputs to base inputs, respectively, whose emitters are mutually coupled via two mutually equal emitter resistors, each transistor pair being coupled to a controllable current source arranged in a common emitter lead and the collectors of the two transistor pairs of the first and the second quadrature section being coupled to a balanced first and a balanced second oscillator output, respectively, and to the bases of the transistor pair of the first amplifier in the second and the first quadrature section, respectively.

To provide the possibility of continuous frequency control through the zero value, the last-mentioned quadrature oscillator is characterized in that each collector of the transistor pair of the first amplifier in each of the two quadrature sections is connected to a supply voltage via a parallel arrangement of a collector resistor and a voltage divider, which voltage divider comprises two series resistors having a common node to which one of the two collectors of the transistor pair of the second amplifier is coupled via a resistor.

The invention will now be described in greater detail with reference to the accompanying drawings which only serve to illustrate the invention and in which mutually corresponding elements have the same reference designations.

DETAILED DESCRIPTION OF THE PREFERRED EMBODIMENTS

Figure 1:
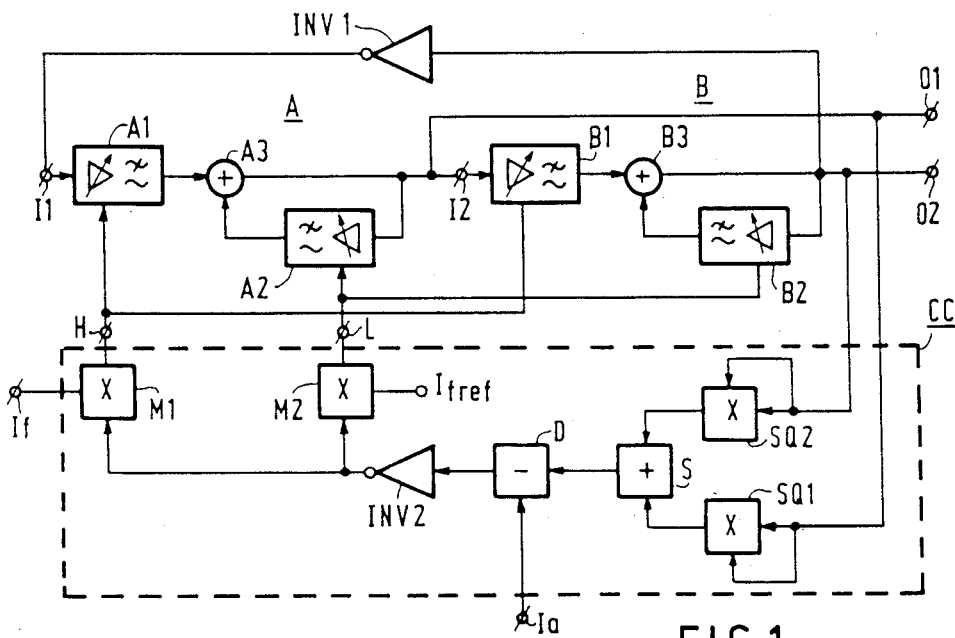
FIG. 1 is a block diagram of a controllable quadrature oscillator according to the invention.

FIG. 1 shows a controllable quadrature oscillator according to the invention, comprising a regenerative loop which incorporates a cascade circuit of two mutually identical quadrature sections—hereinafter briefly referred to as sections—A and B regeneratively fed back from an output 02 of B to an input I1 of A via an inverter circuit INV1. An output 01 of A is connected to an input I2 of B and, together with the output 02 of B, it constitutes a pair of oscillator outputs for supplying a pair of phase quadrature oscillator signals between which the section B is arranged. Each section A and B has a signal path between the input I1, I2 and the output 01, 02, which signal path incorporates a cascade circuit of two stages. Each section A and B comprises one of the two stages and a first amplifier A1, B1 with a low-pass characteristic and the other stage comprises a second amplifier A2, B2 with a low-pass characteristic, respectively, which is provided with a feedback path.

In the embodiment shown the input of the first amplifier A1, B1 in each section is also the input I1, I2 of the relevant section and outputs of the first and second amplifiers A1, A2 and B1, B2 are coupled to signal combination circuits A3 and B3, respectively. Outputs of A3 and B3 constitute the said oscillator outputs 01 and 02, respectively, and are fed back to inputs of the second amplifiers A2 and B2. Consequently, the signal path of the sections A, B incorporates the signal path of the first amplifiers A1, B1 and the feedback path of the second amplifiers A2, B2. The signal path of the second amplifiers A2, B2 is thus outside the signal path of the relevant sections A, B. The first and second amplifiers A1, B1 and A2, B2 are gain controllable by means of first and second control signals h and l, respectively, which are applied in common from a control signal generating circuit to be further described to the two first amplifiers A1 and B1 and second amplifiers A2 and B2 via control terminals H and L, respectively.

Figure 2A:
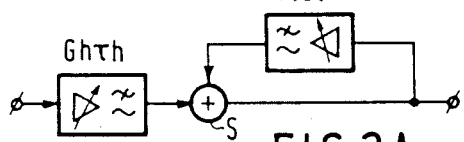
FIG. 2A is a first basic circuit diagram of the quadrature section of a quadrature oscillator of FIG. 1.

To elucidate the operating principle of the quadrature oscillator described so far, reference is made to FIGS. 2A-2D. FIG. 2A shows a basic circuit diagram of a single section corresponding to each of the afore-mentioned sections A and B with a first amplifier Gh, $\tau$h with gain Gh and a first order low-pass characteristic with a time constant $\tau$h and a second amplifier Gl, $\tau$l with a gain Gl and a first order low-pass characteristic with a time constant $\tau$l and a positive feedback. The output signals of the two amplifiers are added together due to the positive feedback in the signal combining circuit S.

Figure 2B:
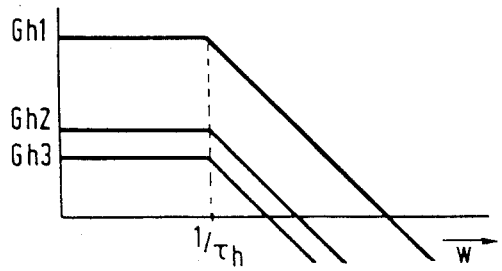
FIGS. 2B and C show gain characteristics of the first and second amplifier stages of the quadrature section of FIG. 2A.

FIG. 2B shows gain characteristics of the first amplifier Gh, $\tau$h at different gain adjustments Gh1–Gh3. It appears that a gain variation of this first amplifier stage only influences the amplitude of the output signal of this first amplifier at a given frequency, but does not influence its phase.

Figure 2C:
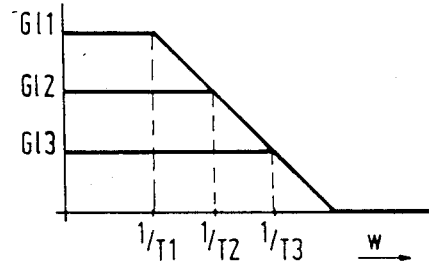

FIG. 2C shows gain characteristics of the stage in which the second positive-feedback amplifier is incorporated, hereinafter referred to as second amplifier stage, i.e measured from the input located at the output of the first amplifier Gh, $\tau$h of the signal combining circuit S to the output of the section at three different adjustments of the gain Gl. It appears therefrom that in spite of a constant value for $\tau$l an effective time constant occurs which varies with the gain adjustment, in the given case for gain adjustments Gl1–Gl3 between T1 and T3. A gain variation in this stage influences both the phase and the amplitude of the output signal of the last-mentioned stage at a given frequency. This provides the possibility of realizing a phase shift in this second amplifier stage by means of a correct gain adjustment of the second amplifier so that in addition to the phase shift in the first amplifier stage a total phase shift of 90° is achieved at a given frequency in the section as a whole. The time constants l and h should then the mutually different and should preferably deviate from each other by at least 10%. By a correct gain adjustment of the first amplifier stage such a gain can be obtained for this frequency that, together with the gain of the second amplifier stage, a gain of one occurs in the section as a whole.

A frequency control is possible by means of a variation in the gain ratio between the first and second amplifiers in each of the two stages. If square wave-shaped oscillator signals are desirable or, more generally the shape of the oscillator signals is of lesser importance, it is sufficient to implement one of the two amplifiers in each section as a controllable amplifier and to implement the other amplifier as a non-controllable amplifier/limiter, for example, an amplifier in combination with a clipper. For example, the first amplifier in each of the two stages can be chosen for this purpose so that only the gain of the second amplifier in each stage should be controlled for a frequency control. In fact, due to the loop operation a gain control of the second amplifier can automatically adjust the gain of the first non-controllable amplifier/limiter at a value which is required for oscillation at the desired frequency.

However, if a low harmonic distortion over a large frequency control range is required, the gain of the two amplifiers in each stage should be controlled in such a way that non-linearities are avoided when adjusting the correct gain ratio between the first and second amplifiers for realizing the oscillation condition for a given desired frequency. To render such an adjustment of the ratio between the control signals h and l possible in a simple manner, use is made of a control generating circuit CC, as is shown in FIG. 1. This circuit is arranged between the pair of oscillator outputs 01, 02 and the said control terminals H and L and comprises an amplitude detection device SQ1,SQ2,S for detecting the amplitude of the vectorial sum of the phase quadrature oscillator signals a and b, followed by an amplitude adjusting device D which is coupled to first inputs of first and second modulators M1 and M2 of a frequency control device via an inverter circuit INV2. A frequency control signal f and a reference level $f_{ref}$ are applied to this frequency control device via second inputs If and Ifref of these two modulators M1 and M2, which results in the beforementioned control signals h and l at outputs of M1 and M2, which control signals are applied to the control terminals H and L. The amplitude detection device SQ1,SQ2,S comprises first and second squarers SQ1 and SQ2, inputs of which are coupled to oscillator outputs 01 and 02 for squaring the oscillator signals a and b at 01 and 02, respectively, and outputs of which are connected to an adder circuit S in which a measure $(a^2+b^2)$ for the amplitude of the vectorial sum of a and b—hereinafter briefly referred to as oscillator amplitude—is obtained. An automatic gain control stabilizing the oscillator amplitude at one given value is obtained by means of a negative feedback of this oscillator amplitude to each of the two control terminals H and L via the inverter circuit INV2.

By subtracting an adjustable amplitude level from the oscillator amplitude to be negatively fed back at the output of the adder circuit S, it is possible to adjus& the amplitude of the phase quadrature oscillator signals a and b at the outputs 01 and 02 at a fixed desired value. To this end the adder circuit S is coupled to a subtractor stage operating as an amplitude adjusting device D, to which stage an amplitude control signal is applied via an amplitude control input Ia, which amplitude control signal is subtracted from the lastmentioned oscillator amplitude to be negatively fed back.

The control of the ratio between the control signals h and l required for a frequency control is realized by a means of a variation of the frequency signal f with respect to the fixed reference level $f_{ref}$ by which the output signal of INV2, i.e. the oscillator amplitude to be negatively fed back is amplitude-modulated and adjusted at a reference level in the first and second modulators M1 and M2, respectively. If the frequency control signal f may assume positive as well as negative values, at least the first modulator M1 and each one of the first controllable amplifiers A1 and B1 should be implemented as multiplier circuits As a result the control signal h as well as the output signals of the first controllable amplifiers A1 and B1 become negative when the frequency control signal f becomes negative. The quadrature oscillator can then supply "positive" frequencies as well as "negative" frequencies, in which case the 90° phase difference between the oscillator output signals a and b at 01 and 02, respectively, may reverse sign.

If this possibility is not utilized, controllable amplifiers of attenuators may be used for M1 and M2 as modulators. The output signal of M1 is subsequently applied as a control signal h to the control terminal H, while the output signal of INV2 brought to a given fixed reference level by means of the frequency reference signal $f_{ref}$ in the modulator M2 is applied as a control signal l to the control terminal L.

It is evident that the operation of the adder circuits A3, B3 and the adder circuit S and the subtractor stage D can be combined with that of the inverter circuits INV1 and INV2, respectively, or these inverter circuits INV1 and INV2 can be arranged at other positions in the oscillator loop and the control loop, respectively.

In the embodiment shown the second amplifiers in the two sections A and B are positively fed back via A3 and B3. This embodiment is particularly suitable for generating oscillation frequencies in a frequency control range which is mainly below the 3 dB resonance frequency of the low-pass characteristic of the second amplifiers A2 and B2. If the low-pass characteristic of these second amplifiers A2 and B2 is produced by parasitic effects which are inherent in an integrated implementation, this 3 dB resonance frequency, hereinafter referred to as fl, may be several tens of MHz and the frequency control range may range from very low frequencies to the order of fl, both positively and negatively.

However, it is alternatively possible to negatively feed back the second amplifiers A2 and B2 of each of the two sections A and B. To this end subtractor circuits should he used for the signal combination circuits A3 and B3. In these subtractor circuits the output signal of the second amplifier A2, B2 should be subtracted from, or added with a negative sign to the output signal of the first amplifier A1, B1 in each of the two sections. As a result, the frequency control range of the controllable quadrature oscillator is mainly above the said 3 dB resonance frequency fl and this embodiment is particularly suitable for very high oscillation frequencies.

Figure 3:
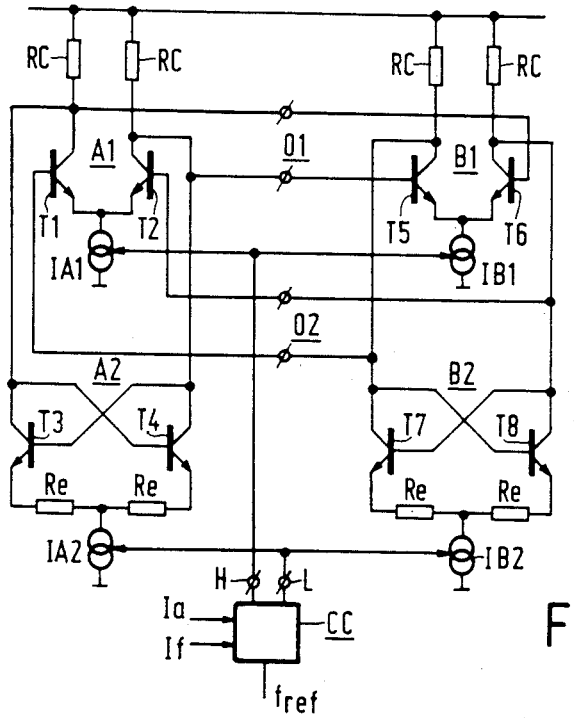
FIG. 3 shows an embodiment of the quadrature oscillator of FIG. 1.

FIG. 3 shows a first balanced realization of the phase quadrature oscillator of FIG. 1 with positively fed back second amplifiers A2 and B2, which embodiment is particularly suitable for integration. A low-pass characteristic is produced for each amplifier as a result of parasitic elements which are inherent in an integrated implementation. In this practical embodiment the first and second amplifiers A1 and A2 of A are realized by means of transistor pairs T1, T2 and T3, T4, respectively, and the first and second amplifiers B1 and B2 of B are realized by means of transistor pairs T5, T6 and T7, T8, respectively. The emitters of T1 and T2 and of T5 and T6 are connected in common to controlled emitter current sources IA1 and IB1, respectively, while the emitters of T3 and T4 and T7 and T8 are each connected to commonly controlled emitter current sources IA2 and IB2, respectively, via mutually equal emitter resistors Re. The emitter resistors Re are used for linearizing the gain of the second amplifiers T3, T4 and T7, T8.

The transistor pairs T3, T4 and T7, T8 are positively fed back by means of a cross-coupling of base and collector and their collector outputs&s are connected to the collector outputs of the transistor pairs T1, T2 and T5, T6, respectively. The common nodes of the collector outputs of T1 and T3; T2 and T4; T5 and T7 and T6 and T8 are each connected to a supply voltage via mutually equal collector resistors Rc and operate as balanced signal combination circuits A3 and B3, respectively, in which the signals are added. These nodes also constitute the balanced out&puts 01 and 02 of the quadrature oscillator. The collectors of T5 and T6 are coupled to the bases of T1 and T2, while the collectors of T2 and T1 are coupled to the bases of T5 and T6, respectively, so that a negative feedback from the output of T5, T6 to the input of T1, T2 is obtained, which results in a low-cost realization of the inverter circuit INV1.

The emitter current sources IA1 and IB2 and IA2 and IB2 and hence the gain of the first and second amplifiers A1, B1 (T1, T2; T5, T6) and A2, B2 (T3, T4; T7, T8) are controllable by means of the control signals h and l from the control terminals H and L, respectively, of the control generating circuit CC. In the present embodiment the gain (Gh) of the first amplifiers A1 and B1 is to increase with respect to that (Gl) of the second amplifiers A2 and B2, and conversely, for an increasing oscillation frequency.

A negative feedback (not shown) for the transistor pairs T3, T4 and T7, T8 operating as second amplifiers A2 and B2 can be realized in a simple manner by mutually short-circuiting the base and collector electrode of each transistor T3, T4, T7 and T8. Due to this negative feedback said common nodes of the collector outputs of these transistors function as signal combination circuits A3, B3 in which the signals are subtracted For an increasIng frequency the gain of the two amplifiers in each section should increase, and conversely. As already stated hereinbefore, such an embodiment with negatively fed back second amplifiers A2 and B2 is particularly suitable for very high oscillation frequencies in the GHz range. In an integrated form oscillation frequencies from 1 to 3 GHz appear to be feasible, using parasitic elements in a technology with transistors at a cut-off frequency of 5 GHz. The low-pass characteristics of the two amplifiers of each section are then of the first order with a time constant $\tau h$ of the first amplifiers A1 and B1 which is considerably larger than the time constant $\tau l$ of the second amplifiers A2 and B2. When using intentionally provided, non-parasitic capacitances, the lower limit of the frequency control range can be brought to a much lower frequency than is possible with parasitic capacitances only. Thus, the frequency control range can be adjusted at a desired frequency range.

The integrated version, shown in FIG. 3, with positively fed back second amplifiers A2 and B2 has a frequency control range which, based on the use of parasitic capacitances, may extend from comparatively low oscillation frequencies of the order of 50 MHz to high oscillation frequencies of the order of 1.5 GHz. If very low oscillation frequencies are desired, the time constant $\tau h$ of the first amplifiers A1 and B1 should be chosen to be large for a smooth frequency control, for which an undesirably large chip surface area is required in the embodiment shown. To prevent this, a third amplifier $G3\tau 3$, as shown in FIG. 4, is used in each section A and B.

Figures 4, 5:
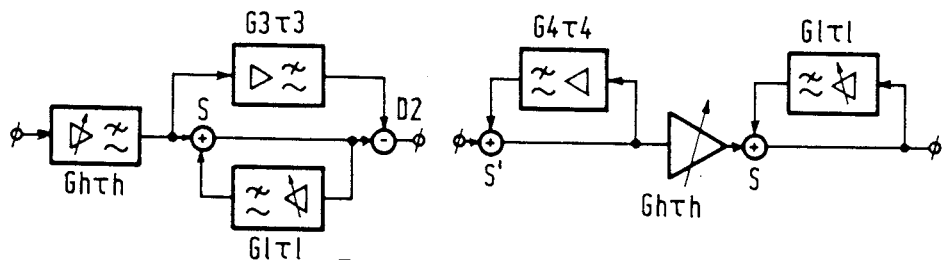
FIG. 4 is a second basic circuit diagram of an integrable quadrature section suitable for comparatively low oscillation frequencies.
FIG. 5 is a third basic circuit diagram of an integrable quadrature section suitable for very low oscillation frequencies.

FIG. 4 shows the basic circuit diagram of a single section which is duplicated in the quadrature oscillator as section A and B, respectively. The third amplifier $G3\tau 3$ has a first order low-pass characteristic with a time constant $\tau 3$ and a fixed gain G3 and is arranged in cascade with the first amplifier $Gh\tau h$. The output signal of the third amplifier $G3\tau 3$ is subtracted via a subtractor stage D2 from the output signal of the above-mentioned second amplifier stage, for which purpose D2 is arranged in the signal path between the coupling of the adder stage S at the input of the second amplifier $Gl\tau l$ and the output of the relevant section. The third amplifier $G3\tau 3$ in each section A and B provides the possibility of realizing a smooth frequency control to very low frequencies at a time constant $\tau h$ of the first amplifier $Gh\tau h$ which is very small or which is even chosen to be zero, for example, for the purpose of low-cost integration.

FIG. 5 shows a further basic circuit diagram of a single section, which when used in a duplicated form as section A and section B in a quadrature oscillator according to the invention, is very suitable for generating very low oscillation frequencies and which, similarly as the section of FIG. 4, avoids the necessity of an undesirably large time constant for the first amplifier $Gh\tau h$. In this basic circuit diagram the first amplifier $Gh\tau h$ is arranged in cascade with a fourth amplifier $G4\tau 4$ having a first order low-pass characteristic and a time constant $\tau 4$ and a fixed gain G4. This fourth amplifier $G4\tau 4$ is positively fed back via an adder stage S' arranged in the signal path. A first input of S' is connected to the input of the section and the fourth amplifier $G4\tau 4$ is arranged between an output and a second input of S'. This output of S' is also coupled to an input of the first amplifier $Gh\tau h$. The fourth amplifier $G4\tau 4$ enables the frequency to he smoothly controlled to very Low frequency values without a noticeably large value for the time constant $\tau 4$ so that the quadrature oscillator as a whole can he integrated at low cost. The first amplifier stage comprising the positively fed back amplifier $G4\tau 4$, together with the first amplifier $Gh\tau h$ which is arranged in cascade therewith (at which $\tau h$ is substantially 0), has an effective time constant $\tau heff$ which is substantially equal to: $\tau h/(1-Gh)$. If, for example, $Gh=0.99$, $heff=100\tau h$ so that a comparatively large time constant heff for the first amplifier stage as a whole is obtained at a very small $\tau h$, i.e. a relatively small chip surface area.

Figures 6, 7:
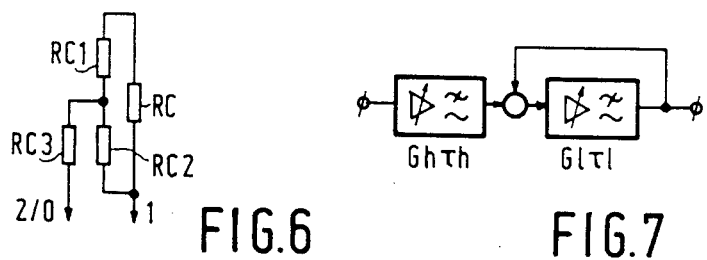
FIG. 6 shows a voltage divider for use in the controllable quadrature oscillator of FIG. 3.
FiG. 7 is a fourth basic circuit diagram of a quadrature section.

The lower limit frequency in the control range of the phase quadrature oscillator of FIG. 3, either or not comprising sections based on the principle of FIG. 4 or 5, can be further decreased by a four-fold application of a voltage divider, as is shown in FIG. 6, in the collector leads of the transistors T1, T2 and T5, T6 of A1 and B1 Such a voltage divider comprises two series resistors Rc1 and Rc2 and a resistor Rc3 which is connected to the common node of Rc1 and Rc2. The two series resistors Rc1 and Rc2 of such a voltage divider are arranged in parallel across each collector resistor Rc so that a parallel circuit thus formed is connected between each collector of T1, T2 and T5, T6 and the supply voltage. The collectors of T3, T4 and T7, T8 and the corresponding terminals of the balanced outputs 01 and 02 are connected to the nodes of Rc1 and Rc2 via the resistors Rc3 of the respective voltage dividers. Consequently, with a control towards low frequencies, the gain of the first amplifiers A1, B1 is further reduced with respect to that of the second amplifiers A2, B2 than is possible by means of only a reduction of the emitter tail currents supplied by the emitter current sources IA1 and IB1. Moreover, the voltage divider reduces parasitic crosstalk between inputs and outputs of the transistors of the first amplifiers A1 and B1. This prevents the oscillator from suddenly changing over to an unwanted oscillator mode, for example, from 300 kHz to 10 MHz in the case of a decreasing gain factor. This results in a possibility of controlling the oscillation frequency down to zero. If a multiplier circuit for the first amplifiers A1 and B1 is chosen in such an embodiment, it is even possible to generate negative oscillation frequencies if the control signals h and 1 are correctly chosen as has alzeady been stated hereinbefore, that is to say, oscillation frequencies whose phase quadrature relation reverses sign. Such a quadrature oscillator is particularly advantageous when used in quadrature receivers of the Weaver type.

FIG. 7 shows a basic circuit diagram of a single section which can be duplicated in the quadrature oscillator according to the invention as section A and section B. The second amplifier Gl$\tau$l is arranged in cascade with the first amplifier Gh$\tau$h, i.e. the signal paths of the two amplifiers Gl$\tau$l and Gh$\tau$h are arranged in the signal path from the input to the output of the section, while the second amplifier Gl$\tau$l is fed back via a feedback path located outside this signal path.

Those skilled in the art will recognize that the above-described embodiments can be modified in dIfferent ways so as to comply with special applications, without departing beyond the scope of the invention. For example, it is possible to use a different sequence in the cascade arrangement of the two amplifiers in each section than the sequence shown, to omit the control generating circuit CC, for example, if square wave-shaped oscillator signals are desired, and to provide a direct control by means of a variation of one of the control signals h and l, to interchange the control signals $I_f$ and $f_{ref}$ in the control generating circuit CC after a suitable adaptation, to incorporate the function of the inverter circuit INV1 and/or INV2 in one of the signal combination circuits A3 and B3 and in the subtractor stage D, respectively, etc. It will therefore be evident that the claims should not be limited to the described special embodiments.

I claim:

1. A controllable quadrature oscillator having first and second oscillator outputs for supplying a pair of phase quadrature oscillator signals, said oscillator comprising: first and second quadrature sections in cascade with each other incorporated in a loop having a regenerative state, the first section being arranged in a first signal path from the first to the second oscillator outputs and realizing a 90° phase shift in the regenerative state of the loop, wherein the first section comprises first and second stages arranged in said first signal path in cascade with each other, the first stage of the first section comprising a first amplifier of the first section having a low-pass characteristic and the second stage of the first section comprising a second amplifier of the first section having a low-pass characteristic, said second amplifier being arranged in a feedback path within said second stage and the gain of at least one of the first and second amplifiers of the first section being controllable for controlling the frequency of the pair of phase quadrature oscillator signals.

2. A controllable quadrature oscillator as claimed in claim 1, wherein the second section comprises first and second stages in cascade with each other arranged in a second signal path from the second to the first oscillator outputs, the first stage of the second section comprising a first amplifier of the second section having a low-pass characteristic and the second stage of the second section comprising a second amplifier of the second section having a low-pass characteristic, said second amplifier of the second quadrature section being arranged in a feedback path within said second stage of said second section.

3. A controllable quadrature oscillator as claimed in claim 2, characterized in that at least the second amplifier of each of the first and second quadrature sections has a first order low-pass characteristic.

4. A controllable quadrature oscillator as claimed in claim 2, characterized in that the gains of both the first and second amplifiers in each of the first and second quadrature sections are controllable, in that the feedback paths in which the second amplifiers of the first and second quadrature sections are arranged are negative feedback paths, and in that for increasing the oscillator frequency the gains of both the first and the second amplifiers in each of the first and second quadrature sections increases, and conversely.

5. A controllable quadrature oscillator as claimed in claim 4, characterized in that the second amplifier of each of the first and second quadrature sections has a 3 dB limit frequency which is lower than that of the first amplifier.

6. A controllable quadrature oscillator as claimed in claim 2, characterized in that the gains of at least one of the first and second amplifiers in each of the first and second quadrature sections is controllable, in that the feedback paths in which the second amplifiers in each of the first and second quadrature sections are arranged are positive feedback paths, and in that for increasing the oscillator frequency the ratio between the gain of the first amplifier and that of the second amplifier in each of the first and second quadrature sections increases, and conversely.

7. A controllable quadrature oscillator as claimed in claim 6, characterized in that the second amplifier of each of the first and second quadrature sections has a 3 dB limit frequency which is higher than that of the first amplifier.

8. A controllable quadrature oscillator as claimed in claim 6, characterized in that for each quadrature section the second stage has an input in common with a third amplifier having a low pass characteristic and a fixed gain, and an output which is coupled to a first input of a subtractor stage, an output of the third amplifier being coupled to a second output of the subtractor stage for subtracting the output signal at the third amplifier from that of the said second stage, the 3 dB limit frequencies of the first and third amplifiers being higher than that of the second amplifier.

9. A controllable quadrature oscillator as claimed in claim 6, characterized in that each quadrature section further comprises a third stage in cascade with said first and second stages, said third stage comprising a third amplifier having a low-pass characteristic and a fixed gain, which third amplifier is arranged in a positive feedback path within said third stage the 3 dB limit frequencies of the first and the third amplifiers being higher than that of the second amplifier.

10. A controllable quadrature oscillator as claimed in claim 1, characterized in that the gains of the first amplifiers as well as those of the second amplifiers are mutually equal and are controllable in mutually equal directions by means of a first and a second control signal at a common first and a second control terminal, respectively, and in that a control signal generating circuit is arranged between the pair of oscillator outputs and the said first and second control terminals and comprises an amplitude detection device for detecting the amplitude of the vectorial sum of the phase quadrature oscillator signals, said amplitude being negatively fed back to the first and second control terminals for the purpose of automatic amplitude control of the oscillator signals.

11. A controllable quadrature oscillator as claimed in claim 10, characterized in that the first amplifier of each of the first and second quadrature sections forms part of a multiplier circuit arranged for multiplying the input signal of the first amplifier with the first control signal.

12. A controllable quadrature oscillator as claimed in claim 10, characterized in that the amplitude detection device is coupled to the two control terminals via an amplitude level control device to which an amplitude control signal is applied from an amplitude control input, which signal is subtracted in the amplitude level control device from the said amplitude to be negatively fed back of the vectorial sum of the phase quadrature oscillator signals.

13. A controllable quadrature oscillator as claimed in claim 12, characterized in that the amplitude detection device comprises first and second squaring circuits which are coupled to the respective oscillator outputs and to two inputs of an adder stage, which adder stage is coupled to the two control terminals via a subtractor stage incorporated in the level control device, the amplitude control signal being subtracted in said subtractor stage from the said amplitude to be negatively fed back of the vectorial sum of the phase quadrature oscillator signals.

14. A controllable quadrature oscillator as claimed in claim 10, characterized by a frequency control device which is arranged between the amplitude detection device and the first and second control terminals to which a frequency control signal is applied from a frequency control input, said frequency control device comprising a modulation device for mutually varying the first and second control signals in dependence upon the frequency control signal.

15. A controllable quadrature oscillator as claimed in claim 1, characterized in that one of the two stages in each of the first and second quadrature sections comprises an amplitude limiter circuit for limiting the amplitude of the output signal of an amplifier incorporated in each said stage.

16. A controllable quadrature oscillator as claimed in claim 1, characterized in that the first and second amplifiers in each of the first and second quadrature sections is an emitter-coupled transistor pair and a transistor pair fed back from collector outputs to base inputs, respectively, whose emitters are mutually coupled via two mutually equal emitter resistors, each transistor pair being coupled to a controllable current source arranged in a common emitter lead and the collectors of the two transistor pairs of the first and second quadrature sections being coupled to a balanced first and a balanced second oscillator output, respectively, and to the bases of the transistor pair of the first amplifier in the second and the first quadrature section, respectively.

17. A controllable quadrature oscillator as claimed in claim 16, characterized in that the collector and the base of the one transistor in the transistor pair of the second amplifier of each of the two quadrature sections is connected to the base and the collector, respectively, of the other transistor.

18. A controllable quadrature oscillator as claimed in claim 16, characterized in that each collector of the transistor pair of the first amplifier in each of the first and second quadrature sections is connected to a supply voltage via a parallel arrangement of a collector resistor and a voltage divider, which voltage divider comprises two series resistors having a common node to which on of the two collectors of the transistor pair of the second amplifier in coupled via a resistor.

19. A controllable quadrature oscillator as claimed in claim 16, characterized in that each transistor of the second amplifier of each of the first and second quadrature sections is short-circuited from the collector to the base.

* * * * *